United States Patent
Smith et al.

(10) Patent No.: US 10,024,654 B2
(45) Date of Patent: Jul. 17, 2018

(54) METHOD AND SYSTEM FOR DETERMINING IN-PLANE DISTORTIONS IN A SUBSTRATE

(71) Applicant: KLA-Tencor Corporation, Milpitas, CA (US)

(72) Inventors: Mark D. Smith, Austin, TX (US); Jose Solomon, Belmont, CA (US); Stuart Sherwin, San Jose, CA (US); Walter Mieher, Los Gatos, CA (US); Ady Levy, San Jose, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 8 days.

(21) Appl. No.: 15/091,021

(22) Filed: Apr. 5, 2016

(65) Prior Publication Data

US 2016/0290789 A1   Oct. 6, 2016

Related U.S. Application Data

(60) Provisional application No. 62/143,708, filed on Apr. 6, 2015.

(51) Int. Cl.
*G01B 9/02* (2006.01)
*G01B 11/02* (2006.01)
(Continued)

(52) U.S. Cl.
CPC ........ *G01B 11/161* (2013.01); *G01B 9/02021* (2013.01); *G01B 9/02027* (2013.01);
(Continued)

(58) Field of Classification Search
CPC ........... G01B 9/02021; G01B 9/02027; G01B 11/0608; G01B 11/161; G01B 11/2441;
(Continued)

(56) References Cited

U.S. PATENT DOCUMENTS 5,444,538 A * 8/1995 Pellegrini ........... G03F 7/70633
355/53
6,847,458 B2 * 1/2005 Freischlad ............. G01B 11/06
356/503
(Continued)

FOREIGN PATENT DOCUMENTS

WO      2013178404 A2    12/2013

OTHER PUBLICATIONS

Duc Minh Ngo, An Analysis of Non-Uniform Stress States in Finite Thin Film/Substrate System: The Need of Full-Field Curvature Measurements, Dissertation, © 2010 by ProQuest LLC, 99 pages, UMI Dissertation Publishing and ProQuest LLC, Ann Arbor, MI.
(Continued)

Primary Examiner — Michael A Lyons
(74) Attorney, Agent, or Firm — Suiter Swantz pc llo

(57) ABSTRACT

The determination of in-plane distortions of a substrate includes measuring one or more out-of-plane distortions of the substrate in an unchucked state, determining an effective film stress of a film on the substrate in the unchucked state based on the measured out-of-plane distortions of the substrate in the unchucked state, determining in-plane distortions of the substrate in a chucked state based on the effective film stress of the film on the substrate in the unchucked state and adjusting at least one of a process tool or an overlay tool based on at least one of the measured out-of-plane distortions or the determined in-plane distortions.

24 Claims, 4 Drawing Sheets

(51) Int. Cl.
  G01L 1/24     (2006.01)
  G01B 11/16    (2006.01)
  G01B 11/24    (2006.01)
  H01L 21/66    (2006.01)

(52) U.S. Cl.
  CPC ...... *G01B 11/2441* (2013.01); *G01B 2210/56* (2013.01); *H01L 22/12* (2013.01)

(58) Field of Classification Search
  CPC ..... G01B 2210/56; H01L 22/00; H01L 22/10; H01L 22/12
  See application file for complete search history.

(56) References Cited

U.S. PATENT DOCUMENTS

| | | | |
|---|---|---|---|
| 7,209,857 B2 | 4/2007 | Sato et al. | |
| 7,712,068 B2 | 5/2010 | Ren et al. | |
| 8,065,109 B2 | 11/2011 | Veeraraghavan et al. | |
| 8,068,234 B2* | 11/2011 | Tang | G01B 9/02021 356/503 |
| 8,768,665 B2 | 7/2014 | Veeraraghavan et al. | |
| 9,087,176 B1 | 7/2015 | Chang et al. | |
| 9,116,442 B2 | 8/2015 | Adel et al. | |
| 2004/0090611 A1 | 5/2004 | Choi et al. | |
| 2004/0146792 A1 | 7/2004 | Nimmakayala et al. | |
| 2006/0123919 A1 | 6/2006 | Lovell et al. | |
| 2009/0063378 A1 | 3/2009 | Izikson | |
| 2011/0172982 A1 | 7/2011 | Veeraraghavan et al. | |
| 2011/0216294 A1 | 9/2011 | Menchtchikov et al. | |
| 2013/0089935 A1 | 4/2013 | Vukkadala et al. | |
| 2014/0107998 A1 | 4/2014 | Vukkadala et al. | |
| 2014/0111810 A1* | 4/2014 | Shen | G01B 9/0203 356/511 |
| 2015/0120216 A1 | 4/2015 | Vukkadala et al. | |
| 2015/0363536 A1 | 12/2015 | Chidambarrao et al. | |
| 2016/0062252 A1 | 3/2016 | Veeraraghavan et al. | |

OTHER PUBLICATIONS

PCT Search Report for PCT/US2016/026148 dated Jun. 30, 2016, 5 pages.

Brunner et al., Characterization of wafer geometry and overlay error on silicon wafers with nonuniform stress, J. Micro/Nanolith. MEMS MOEMS 12(4), Apr. 30, 2002 (Oct.-Dec. 2013), pp. 043002-1-043002-12.

Fernlund et al., Finite element based prediction of process-induced deformation of autoclaved composite structures using 2D process analysis and 3D structural analysis, vol. 62, Issue 2, Nov. 2003, pp. 223-234.

Turner et al., Monitoring Process-Induced Overlay Errors through High-Resolution Wafer Geometry Measurements, Metrology, Inspection, and Process Control for Microlithography XXVIII, Proc. of SPIE, vol. 9050, pp. 905013-1-905013-9, Apr. 2014.

Turner et al., Predicting distortions and overlay errors due to wafer deformation during chucking on lithography scanners, Journal of Micro/Nanolithography, MEMS, and MOEMS, vol. 8, Issue 4, Oct. 1, 2009, 8 pages.

Veeraraghaven et al., Simulation of non-uniform wafer geometry and thin film residual stress on overlay errors, SPIE Proceedings vol. 7971, Metrology, Inspection, and Process Control for Microlithography XXV, Apr. 20, 2011, 6 pages.

* cited by examiner

METHOD AND SYSTEM FOR DETERMINING IN-PLANE DISTORTIONS IN A SUBSTRATE

CROSS-REFERENCE TO RELATED APPLICATION

The present application claims benefit under 35 U.S.C. § 119(e) and constitutes a regular (non-provisional) patent application of U.S. Provisional Application Ser. No. 62/143,708, filed Apr. 6, 2015, entitled SIMPLIFIED MODEL FOR PROCESS-INDUCED DISTORTION PREDICTION, which is incorporated herein by reference in the entirety.

TECHNICAL FIELD

The present invention generally relates to the prediction of in-plane distortion of a chucked substrate, and, in particular, the prediction of in-plane distortion of a chucked substrate base on measurements of out-of-plane distortions of the substrate in an unchucked stated.

BACKGROUND

Fabricating semiconductor devices such as logic and memory devices typically includes processing a substrate such as a semiconductor wafer using a large number of semiconductor fabrication processes to form various features and multiple levels of the semiconductor devices. For example, lithography is a semiconductor fabrication process that involves transferring a pattern from a reticle to a resist arranged on a semiconductor wafer. Additional examples of semiconductor fabrication processes include, but are not limited to, chemical-mechanical polishing (CMP), etching, deposition, and ion implantation. Multiple semiconductor devices may be fabricated in an arrangement on a single semiconductor wafer and then separated into individual semiconductor devices.

As used throughout the present disclosure, the term "wafer" generally refers to substrates formed of a semiconductor or non-semiconductor material. For example, a semiconductor or non-semiconductor material may include, but are not limited to, monocrystalline silicon, gallium arsenide, and indium phosphide. A wafer may include one or more layers or films. For example, such layers may include, but are not limited to, a resist, a dielectric material, a conductive material, and a semiconductive material. Many different types of such layers are known in the art, and the term wafer as used herein is intended to encompass a wafer on which all types of such layers or films may be formed. Many different types of devices may be formed on a wafer, and the term wafer as used herein is intended to encompass a wafer on which any type of device known in the art may be fabricated.

Generally, certain requirements are established for the flatness and thickness uniformity of wafers. However, the various process steps applied to a wafer required during device fabrication as well as thickness variations may result in elastic deformation of the wafer. These elastic deformations may cause significant distortions. Such distortions may include in-plane distortions (IPD) and/or out-plane distortions (OPD). Distortions may lead to errors in downstream applications such as overlay errors in lithographic patterning or the like. Therefore, providing the ability to predict/ estimate process-induced distortions is a vital part of semiconductor manufacturing process. As such, it would be advantageous to provide a system and method that provides improved wafer distortion capabilities.

SUMMARY

A system for determining in-plane distortions of a substrate is disclosed, in accordance with one embodiment of the present disclosure. In one embodiment, the system includes a substrate geometry measurement tool configured to measure out-of-plane distortions of the substrate in an unchucked state. In another embodiment, the system includes a controller communicatively coupled to the measurement tool, the controller including one or more processors configured to execute a set of program instructions. In another embodiment, the program instructions configured to cause the one or more processors to: receive one or more measurement results indicative of out-of-plane distortions of the substrate in the unchucked state from the measurement tool; determine an effective surface film stress of the substrate in the unchucked state based on the measured out-of-plane distortions of the substrate in the unchucked state with a two-dimensional plate model; determine in-plane distortions of the substrate in a chucked state based on the effective surface film stress of the substrate in the unchucked state with the two-dimensional plate model; and adjust at least one of a process tool or a metrology tool based on at least one of the measured out-of-plane distortions or the determined in-plane distortions.

A system for determining in-plane distortions of a substrate is disclosed, in accordance with one embodiment of the present disclosure. In one embodiment, the system includes a substrate geometry measurement tool configured to measure out-of-plane distortions of the substrate in an unchucked state. In another embodiment, the system includes a controller communicatively coupled to the measurement tool, the controller including one or more processors configured to execute a set of program instructions. In another embodiment, the program instructions configured to cause the one or more processors to: receive one or more measurement results indicative of out-of-plane distortions of the substrate in the unchucked state from the measurement tool; apply a two-dimensional plate model to determine in-plane distortions of the substrate in a chucked state based on the out-of-plane distortions of the substrate in the unchucked state; and adjust at least one of a process tool or an overlay tool based on at least one of the measured out-of-plane distortions or the determined in-plane distortions.

A system for determining in-plane distortions of a substrate is disclosed, in accordance with one embodiment of the present disclosure. In one embodiment, the system includes a substrate geometry measurement tool configured to measure out-of-plane distortions of the substrate in an unchucked state. In another embodiment, the system includes a controller communicatively coupled to the measurement tool, the controller including one or more processors configured to execute a set of program instructions. In another embodiment, the program instructions configured to cause the one or more processors to: receive one or more measurement results indicative of out-of-plane distortions of the substrate in the unchucked state from the measurement tool; apply an Euler-Lagrange plate model to determine in-plane distortions of the substrate in a chucked state based on the out-of-plane distortions of the substrate in the unchucked state; and adjust at least one of a process tool or an overlay tool based on at least one of the measured out-of-plane distortions or the determined in-plane distortions.

A method for determining in-plane distortions of a substrate is disclosed, in accordance with one embodiment of the present disclosure. In one embodiment, the method includes measuring one or more out-of-plane distortions of the substrate in an unchucked state. In another embodiment, the method includes determining, with a two-dimensional plate model, an effective film stress of a film on the substrate in the unchucked state based on the measured out-of-plane distortions of the substrate in the unchucked state. In another embodiment, the method includes determining, with the two-dimensional plate model, in-plane distortions of the substrate in a chucked state based on the effective film stress of the film on the substrate in the unchucked state. In another embodiment, the method includes adjusting at least one of a process tool or an overlay tool based on at least one of the measured out-of-plane distortions or the determined in-plane distortions.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION OF THE INVENTION

Reference will now be made in detail to the subject matter disclosed, which is illustrated in the accompanying drawings.

Referring generally to FIGS. 1A through 3, a method and system for determining in-plane distortions in a substrate are described in accordance with the present disclosure.

Embodiments of the present disclosure are directed to systems and methods for determining in-plane distortions of a chucked substrate based on the measured out-of-plane distortions of an unchecked substrate (i.e., free standing substrate). Embodiments of the present disclosure utilize linear elastic solid body deformation mechanics of thin objects (e.g., two-dimension plate theory) to derive a model that allows for the prediction of in-plane distortion of a chucked wafer from measured out-of-plane distortions of an unchucked substrate.

Wafer shape change resulting from wafer processing and/or wafer chucking may induce in-plane distortions (IPD) within the wafer, which may lead to overlay error between a first patterning step (N) and a subsequent patterning step (N+1). The relationship between wafer shape change and overlay error is described in detail in K. Turner et al, "*Predicting Distortions and Overlay Errors Due to Wafer Deformation During Chucking on Lithography Scanners*", J. Micro/Nanolith, MEMS MOEMS 8(4), 043015, (October-December 2009), which is incorporated in the entirety herein by reference. In addition, chucking induced wafer shape change and in-plane distortions are described generally in U.S. patent application Ser. No. 12/778,013 by Veeraraghavan et al., filed on May 11, 2010, which is incorporated in the entirety herein by reference. The measurement of process induced overlay errors is described in Turner et al. in "Monitoring Process-Induced Overlay Errors through High-Resolution Wafer Geometry Measurements" Proc. SPIE 2014, which is incorporated herein by reference in the entirety. The use of wafer geometry metric analysis for improved overlay and process control is described in U.S. Patent Publication No. 2013/0089935 by Vukkadala et al., filed on May 21, 2012 which is incorporated in the entirety herein by reference. The prediction of in-plane distortions of a wafer introduced by the semiconductor wafer chucking process is described in U.S. Patent Publication No. 2014/0107998 by Vukkadala et al., filed on Jan. 7, 2013, which is incorporated in the entirety herein by reference.

Figure 1A:
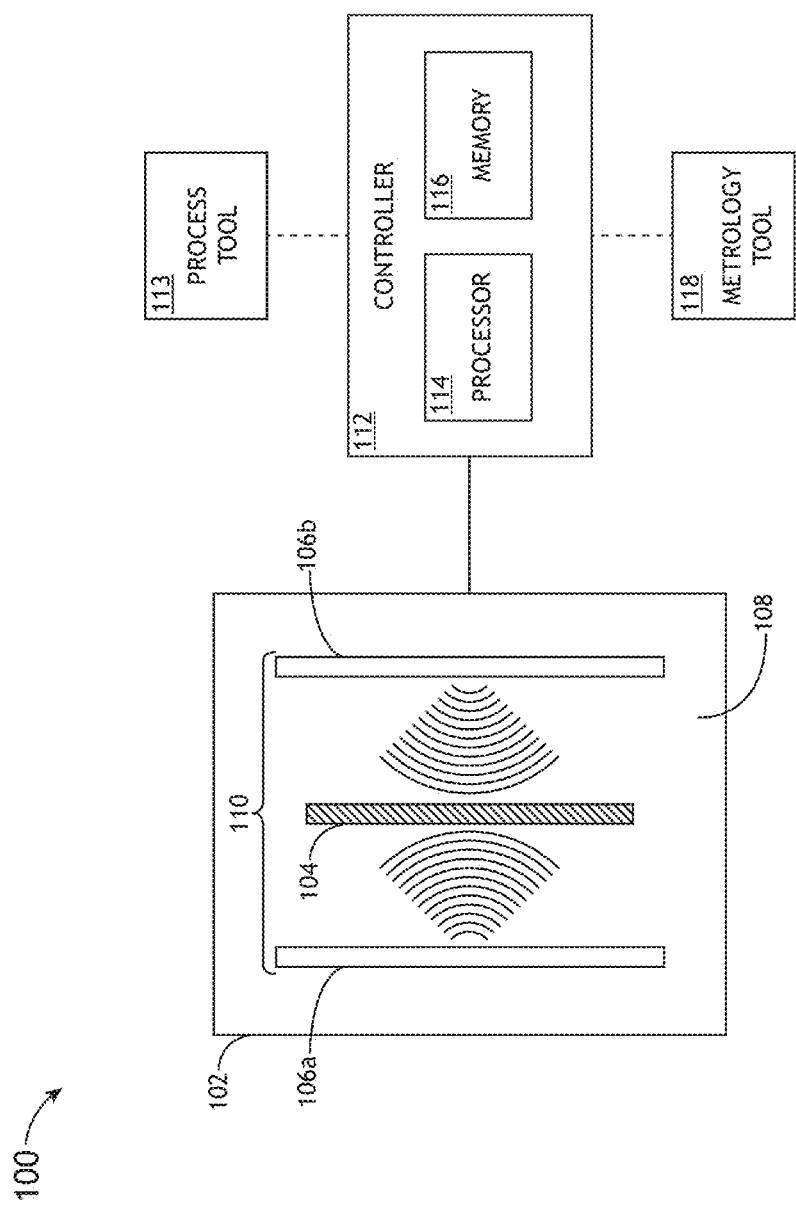
FIG. 1A is a block diagram view of a system for measuring substrate geometry, in accordance with one embodiment of the present disclosure.

FIG. 1A illustrates a conceptual block diagram view of a system 100 for determining in-plane distortions in a substrate, in accordance with one or more embodiments of the present disclosure.

In one embodiment, the system 100 includes a substrate geometry measurement tool 102. In one embodiment, the substrate geometry measurement tool 102 may include any wafer shape measurement tool known in the art. In one embodiment, the substrate geometry measurement tool 102 may include a Dual Fizeau interferometer 110 suitable for simultaneously measuring out-of-plane distortion (i.e., displacement in direction normal to surface of the substrate) of the front-side of the substrate 104 and the back-side of the substrate 104. In another embodiment, the system 100 may include one or more controllers 112 communicatively coupled to the substrate geometry measurement tool 102 and configured to receive out-of-plane distortion measurements from the measurement tool 102.

Figure 1B:
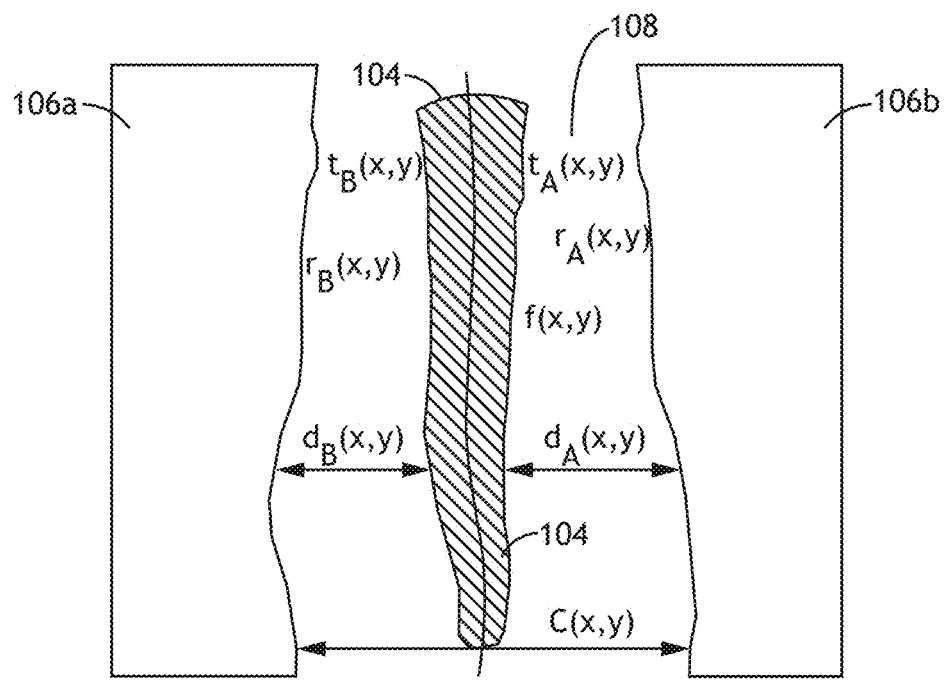
FIG. 1B illustrates a schematic view of a dual Fizeau cavity of a dual Fizeau interferometer, in accordance with one embodiment of the present disclosure.

FIG. 1B illustrates a conceptual view of a Dual Fizeau cavity, in accordance with one or more embodiments of the present disclosure. As shown in FIG. 2B, the Dual Fizeau cavity may be configured to hold the substrate 104 in a substantially vertical position. For instance, the Dual Fizeau cavity 108 many include a set of point contact devices (not shown) configured to receive and hold the substrate 104 in a substantially upright position in a substantially free state (i.e., unchucked state). Utilizing the two reference flats 106a, 106b, which serve as the reference surfaces for the interferometer, the Dual Fizeau interferometer 110 may analyze various parameters associated with the substrate 104 and its spatial relationship to the reference flats 106a and 106b.

Utilizing the Dual Fizeau interferometer 110, the measurement tool 102 may simultaneously measure out-of-plane distortions (or height variations) of the front-side surface and/or back-side surface of the substrate 104. It is further noted that the shape value at each of the measured points of the front-side and/or back-side surface may then be calculated utilizing the measured out-of-plane distortion at those points. The shape, s(x,y), of the substrate as a function of X-Y position on the surface of the substrate may be expressed as:

$$s(x,y) \approx \frac{1}{2}(d_A(x,y) - d_B(x,y)) - \text{Tilt} \qquad (1)$$

where $d_A(x,y)$ represents the cavity distance between the reference flat A 106a of cavity 108 and a first side (e.g., front-side) of the substrate 104, $d_B(x,y)$ represents the cavity distance between the reference flat B 106b of cavity 108 and a second side (e.g., back-side) of the substate 104, Tilt represents the tilt of the substrate 104 within the cavity 108. Utilizing the relationship of Eq. 1 a two-dimensional X-Y map of shape may be constructed by calculating shape at a plurality of positions on the substate 104. For example, a shape map having a lateral resolution of approximately 500 μm may be constructed utilizing the out-of-plane measurements acquired with the interferometry system 110 and the corresponding shape value at each of the measured points on the wafer.

Dual Fizeau interferometry suitable for measuring front-side and back-side topography of a substrate is described in detail in Klaus Freischlad et al., "*Interferometry for Wafer Dimensional Metrology*", Proc. SPIE 6672, 1 (2007), which is incorporated in the entirety herein by reference. In addition, Dual sided interferometry is described generally in U.S. Pat. No. 6,847,458 by Freischlad et al., entitled *Method and Apparatus for Measuring the Shape and Thickness Variation of Polished Opaque Plates*, issued on Jan. 25, 2005, U.S. Pat. No. 8,068,234 by Tang et al., entitled *Method and Apparatus for Measuring Shape or Thickness Information of a Substrate*, issued on Nov. 29, 2011, which are both incorporated in the entirety herein by reference.

In another embodiment, the system 100 includes a controller 112. In one embodiment, the controller 112 is communicatively coupled to the substrate geometry measurement tool 102. For example, the controller 112 may be coupled to the output of a detector (not shown) of the substrate geometry measurement tool 102. The controller 112 may be coupled to the detector in any suitable manner (e.g., by one or more transmission media indicated by the line shown in FIG. 1A) such that the controller 112 can receive the output generated by the measurement tool 102.

In one embodiment, the controller 112 includes one or more processors 114. In one embodiment, the one or more processors 114 are configured to execute a set of program instructions. In another embodiment, the program instructions are configured to cause the one or more processors to receive one or more measurement results indicative of out-of-plane distortions of the substrate 104 in the unchucked state from the measurement tool 102.

In one embodiment, the program instructions are configured to cause the one or more processors to construct or retrieve from memory a 2-D plate model based on 2-D plate theory (e.g., linear elastic solid body deformation mechanics of thin objects on a disk). Utilizing the 2-D plate model a set of partial differential equations of disk may be derived. The one or more processors 114 may then solve these equations to determine predicted in-line plane distortion of a chucked substrate 104 based on measurements of out-of-plane distortions of the unchucked substrate 104.

In one embodiment, the program instructions are configured to cause the one or more processors to determine, with the 2-D plate model, an effective surface film stress of the substrate 104 in the unchucked state based on the measured out-of-plane distortions of the substrate 104 in the unchucked state. In this regard, the one or more processors 114 may solve the equations of the 2-D plate model to determine the effective surface film stress of the substrate 104 in the unchucked state based on the measured out-of-plane distortions of the substrate 104 in the unchucked state. It is noted that the effective film stress is that stress which causes the out-of-plane distortion in the substrate 104 in the unchucked state.

In another embodiment, the program instructions are configured to cause the one or more processors to determine in-plane distortions of the substrate 104 in a chucked state based on the effective surface film stress of the substrate in the unchucked state. In this regard, the effective surface film stress predicted using the measured out-of-plane distortions of the unchucked substrate 104 serves as an input to calculate the in-plane distortions of the substrate 104 in a chucked state.

In another embodiment, the program instructions are configured to cause the one or more processors to adjust at least one of a process tool or an overlay tool based on at least one of the measured out-of-plane distortions or the determined in-plane distortions.

The one or more processors 114 of controller 112 may include any one or more processing elements known in the art. In this sense, the one or more processors 114 may include any microprocessor-type device configured to execute software algorithms and/or instructions. In one embodiment, the one or more processors 114 may consist of a desktop computer, mainframe computer system, workstation, image computer, parallel processor, or other computer system (e.g., networked computer) configured to execute a program configured to operate the system 100, as described throughout the present disclosure. It should be recognized that the steps described throughout the present disclosure may be carried out by a single computer system or, alternatively, multiple computer systems. In general, the term "processor" may be broadly defined to encompass any device having one or more processing elements, which execute program instructions stored in memory 116. Moreover, different subsystems of the system 100 (e.g., process tool, overlay metrology tool, display or user interface) may include processor or logic elements suitable for carrying out at least a portion of the steps described throughout the present disclosure. Therefore, the above description should not be interpreted as a limitation on the present disclosure but merely an illustration.

The memory 116 may include any storage medium known in the art suitable for storing program instructions executable by the associated one or more processors 114. For example, the memory 116 may include a non-transitory memory medium. For instance, the memory 116 may include, but is not limited to, a read-only memory, a random access memory, a magnetic or optical memory device (e.g., disk), a magnetic tape, a solid state drive and the like. In another embodiment, the memory 116 is configured to store one or more results from the measurement tool 102 and/or the output of the various steps described herein. It is further noted that memory 116 may be housed in a common controller housing with the one or more processors 114. In an alternative embodiment, the memory 116 may be located remotely with respect to the physical location of the processors and controller 112. For instance, the one or more processors 114 of controller 112 may access a remote memory (e.g., server), accessible through a network (e.g., internet, intranet and the like). In another embodiment, the memory 116 includes program instructions for causing the one or more processors 114 carry out the various steps described through the present disclosure.

In another embodiment, the controller 112 may receive and/or acquire data or information from other sub-system (e.g., inspection results from an inspection system or metrology results from a metrology system) by a transmission medium that may include wireline and/or wireless portions. In another embodiment, the controller 112 may transmit one or more results and/or control signals to one or more subsystems of system 100. For instance, controller 112 may transmit one or more results and/or control signals to a process tool (e.g., feedback data to upstream process tool of fabrication line), overlay metrology tool (e.g., feedforward data to downstream overlay metrology tool), display or user interface. In this manner, the transmission medium may serve as a data link between the controller 112 and other subsystems of the system 100. Moreover, the controller 112 may send data to external systems via a transmission medium (e.g., network connection).

In another embodiment, the system 100 includes a user interface. In one embodiment, the user interface is communicatively coupled to the one or more processors 114 of controller 112. In another embodiment, the user interface device may be utilized by controller 112 to accept selections and/or instructions from a user. In some embodiments, described further herein, a display may be used to display data to a user (not shown). In turn, a user may input selection and/or instructions (e.g., a user selection of measured field sites or field sites for regression process) responsive to data displayed to the user via the display device.

The user interface device may include any user interface known in the art. For example, the user interface may include, but is not limited to, a keyboard, a keypad, a touchscreen, a lever, a knob, a scroll wheel, a track ball, a switch, a dial, a sliding bar, a scroll bar, a slide, a handle, a touch pad, a paddle, a steering wheel, a joystick, a bezel input device or the like. In the case of a touchscreen interface device, those skilled in the art should recognize that a large number of touchscreen interface devices may be suitable for implementation in the present invention. For instance, the display device may be integrated with a touchscreen interface, such as, but not limited to, a capacitive touchscreen, a resistive touchscreen, a surface acoustic based touchscreen, an infrared based touchscreen, or the like. In a general sense, any touchscreen interface capable of integration with the display portion of a display device is suitable for implementation in the present invention. In another embodiment, the user interface may include, but is not limited to, a bezel mounted interface.

The display device (not shown) may include any display device known in the art. In one embodiment, the display device may include, but is not limited to, a liquid crystal display (LCD). In another embodiment, the display device may include, but is not limited to, an organic light-emitting diode (OLED) based display. In another embodiment, the display device may include, but is not limited to a CRT display. Those skilled in the art should recognize that a variety of display devices may be suitable for implementation in the present invention and the particular choice of display device may depend on a variety of factors, including, but not limited to, form factor, cost, and the like. In a general sense, any display device capable of integration with a user interface device (e.g., touchscreen, bezel mounted interface, keyboard, mouse, trackpad, and the like) is suitable for implementation in the present invention.

The embodiments of the system 100 illustrated in FIGS. 1A-1B may be further configured as described herein. In addition, the system 100 may be configured to perform any other step(s) of any of the method embodiment(s) described herein.

Figure 2:
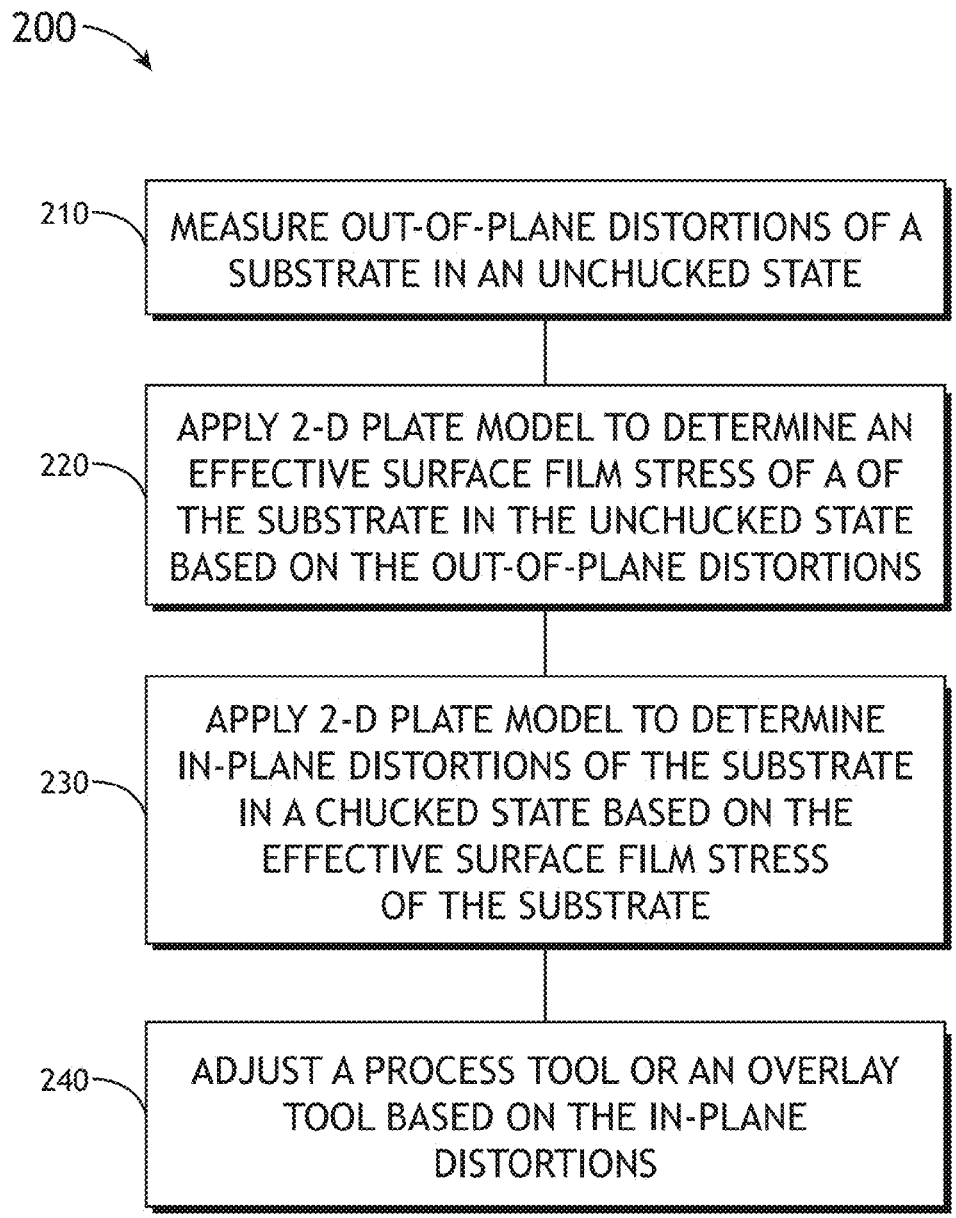
FIG. 2 is a flow diagram illustrating steps performed in a method for determining in-plane distortions in a substrate, in accordance with one embodiment of the present disclosure.

FIG. 2 is a flow diagram illustrating steps performed in a method 200 of determining in-plane distortions in a substrate, in accordance with one or more embodiments of the present disclosure. It is noted herein that the steps of method 200 may be implemented all or in part by the system 100. It is further recognized, however, that the method 200 is not limited to the system 100 in that additional or alternative system-level embodiments may carry out all or part of the steps of method 200.

In step 210, out-of-plane distortions of the substrate 104 in an unchucked state are measured. For example, as shown in FIGS. 1A and 1B, out-of-plane distortions (e.g., displacements) of the substrate 104 may be measured using the substrate geometry measurement tool 102. For instance, out-of-plane distortions of the substrate 104 may be measured using a dual Fizeau interferometer. Further, the out-of-plane distortions measured by the geometry measurement tool 102 may be transmitted to controller 112. In one embodiment, the out-of-plane distortion measurements may be stored in memory 116 for later processing by the one or more processors 114.

In step 220, the 2-D plate model is applied to determine an effective film stress, which causes the out-of-plane distortions of the substrate 104, in the unchucked state based on the measurement of the out-of-plane distortions. For example, one or more processors 114 of controller 112 may apply the 2-D plate model to the out-of-plane measurements acquired from the substrate 104 to determine the effective film stress capable of causing the out-of-plane distortions of the substrate 104 in the unchucked state (i.e., not been chucked into a flat configuration). Equation 1 below describes the case of momentum balance for the in-plane x- and y-directions:

$$\frac{\partial \sigma_{xx}}{\partial x} + \frac{\partial \sigma_{yx}}{\partial y} + \frac{\partial \sigma_{zx}}{\partial z} = 0 \quad (2)$$
$$\frac{\partial \sigma_{xy}}{\partial x} + \frac{\partial \sigma_{yy}}{\partial y} + \frac{\partial \sigma_{zy}}{\partial z} = 0$$

Equation 2 provides the stresses for the case of linear elasticity and line von Karman strains:

$$\sigma_{xx} = \frac{E}{1-\upsilon^2}\left(\frac{\partial u_0}{\partial x} - z\frac{\partial^2 w_0}{\partial x^2} + \upsilon\frac{\partial v_0}{\partial y} - \upsilon z\frac{\partial^2 w_0}{\partial y^2}\right) \quad (3)$$
$$\sigma_{yy} = \frac{E}{1-\upsilon^2}\left(\upsilon\frac{\partial u_0}{\partial x} - \upsilon z\frac{\partial^2 w_0}{\partial x^2} + \upsilon\frac{\partial v_0}{\partial y} - z\frac{\partial^2 w_0}{\partial y^2}\right)$$
$$\sigma_{xy} = \frac{E}{2(1+\upsilon)}\left(\frac{\partial u_0}{\partial y} + \frac{\partial v_0}{\partial x} - 2z\frac{\partial^2 w_0}{\partial x \partial y}\right)$$

The effective film surface stress components are found by manipulating Equation 2 and Equation 3 to arrive at Equations 4-5 below:

$$\sigma_{zx}|_{z=top} = \frac{h^2 E}{6(1-\upsilon^2)}\left(\frac{\partial^3 w_0}{\partial x^3} + \frac{\partial^3 w_0}{\partial x \partial y^2}\right) \quad (4)$$
$$\sigma_{zy}|_{z=top} = \frac{h^2 E}{6(1-\upsilon^2)}\left(\frac{\partial^3 w_0}{\partial x^2 \partial y} + \frac{\partial^3 w_0}{\partial y^2}\right)$$

-continued $$\sigma_{zx}|_{z=top} = \frac{h^2 E}{6(1-\upsilon^2)} \frac{\partial}{\partial x}\left(\frac{\partial^2 w_0}{\partial x^2} + \frac{\partial^2 w_0}{\partial y^2}\right) \quad (5)$$

$$\sigma_{zy}|_{z=top} = \frac{h^2 E}{6(1-\upsilon^2)} \frac{\partial}{\partial y}\left(\frac{\partial^2 w_0}{\partial x^2} + \frac{\partial^2 w_0}{\partial y^2}\right)$$

where h is thickness, $w_0$ is displacement in z-direction, E is Young's modulus of the substrate, and $\upsilon$ is Poisson's ratio.

It is noted that to solve Equations 4-5 a number of approaches may be applied. For example, a fitting procedure may be applied to fit a function to the out of plane distortion ($w_0$). The fitting function may include any fitting function know in the art such as, but not limited to, a Zernike polynomial. After fitting, derivatives may be calculated for the fitted function, so as to calculate the stresses above. By way of another example, a finite difference method may be utilized to find the stress components of Equations 4-5. By way of another example, a finite element method may be utilized to find the stress components of Equations 4-5. By way of another example, a finite volume method may be utilized to find the stress components of Equations 4-5. It is noted that any number of analytical approaches known in the art may be applied to Equations 4-5 above, such as, but not limited to, the various analytical methods disclosed herein to analyze the various differential equations of the present disclosure.

In step 230, the 2-D plate model is applied to determine in-plane distortions of the substrate 104 in a chucked state based on the effective surface film stress of the substrate in the unchucked state found in step 220. For example, one or more processors 114 of controller 112 may apply the 2-D plate model (or an additional 2-D plate model) to the determine in-plane distortions of the substrate 104 in a chucked state based on the effective surface film stress of the substrate in the unchucked state. In this regard, the effective surface film stress found in step 220 serves as an input to a 2-D plate model based on a disk formulation to calculate the in-plane distortions of the substrate 104 in a chucked state into an approximately flat configuration. For example, the stress components of Equations 4--5 may be used as forcing terms in the calculation of the in-plane distortion of the substrate 104 in the chucked state, resulting in the following:

$$\sigma_{zx}|_{z=top} = \quad (6)$$
$$-\frac{hE}{1-\upsilon^2}\left(\frac{\partial^2 u_0}{\partial x^2} + \frac{\partial^2 u_0}{\partial y^2}\right) - \frac{hE}{1-\upsilon^2}\frac{(1+\upsilon)}{2}\frac{\partial}{\partial y}\left(\frac{\partial v_0}{\partial x} - \frac{\partial u_0}{\partial y}\right)$$

$$\sigma_{zy}|_{z=top} = -\frac{hE}{1-\upsilon^2}\left(\frac{\partial^2 v_0}{\partial x^2} + \frac{\partial^2 v_0}{\partial y^2}\right) - \frac{hE}{1-\upsilon^2}\frac{(1+\upsilon)}{2}\frac{\partial}{\partial x}\left(\frac{\partial u_0}{\partial y} - \frac{\partial v_0}{\partial x}\right)$$

where $u_0$ represent the in-plane displacements in the substrate 104.

In another embodiment, the in-plane distortion of the substrate 104 in the chucked state is calculated by applying one or more solution techniques to Equation 6 above. For example, a finite difference method may be applied to Equation 6 to determine the in-plane distortion of the substrate 104. By way of another example, a finite element method may be applied to Equation 6 to determine the in-plane distortion of the substrate 104. By way of another example, a finite volume method may be applied to Equation 6 to determine the in-plane distortion of the substrate 104. By way of another example, a method of moments analysis may be applied to Equation 6 to determine the in-plane distortion of the substrate 104. By way of another example, a power series may be applied to Equation 6 to determine the in-plane distortion of the substrate 104. By way of another example, the closed-form solution to Equation 6 may be found to determine the in-plane distortion of the substrate 104. By way of another example, two or more methods may be mixed to determine the in-plane distortion of the substrate 104. For instance, Fourier series analysis may be combined with finite difference analysis to determine the in-plane distortion of the substrate 104.

In an alternative embodiment, step 220 may be removed and the in-plane distortion of substrate 104 in the chucked state may be calculated directly from the measured out-of-plane distortions from tool 102. For example, starting with Equations 2 and Equations 3 the system 100 may reduce the model to a single set of equations. For instance, the effective surface film stress may be algebraically eliminated so that only a single set of equations is required to calculate the in-plane distortions of the substrate 104 in an unchucked state. Following algebraic elimination of the effective surface film stress, Equation 7 provides:

$$-\nabla^2 u_0 - \frac{(1+\upsilon)}{2}\frac{\partial}{\partial y}\left(\frac{\partial v_0}{\partial x} - \frac{\partial u_0}{\partial y}\right) = \frac{h}{6}\nabla^2\left(\frac{\partial w_0}{\partial x}\right) \quad (7)$$

$$-\nabla^2 v_0 - \frac{(1+\upsilon)}{2}\frac{\partial}{\partial x}\left(\frac{\partial u_0}{\partial y} - \frac{\partial v_0}{\partial x}\right) = \frac{h}{6}\nabla^2\left(\frac{\partial w_0}{\partial y}\right)$$

In another embodiment, the in-plane distortion of the substrate 104 in the chucked state is calculated by applying one or more solution techniques to Equation 7 above. For example, a finite difference method may be applied to Equation 7 to determine the in-plane distortion of the substrate 104. By way of another example, a finite element method may be applied to Equation 7 to determine the in-plane distortion of the substrate 104. By way of another example, a finite volume method may be applied to Equation 7 to determine the in-plane distortion of the substrate 104. By way of another example, a method of moments analysis may be applied to Equation 7 to determine the in-plane distortion of the substrate 104. By way of another example, a power series may be applied to Equation 7 to determine the in-plane distortion of the substrate 104. By way of another example, the closed-form solution to Equation 7 may be found to determine the in-plane distortion of the substrate 104. By way of another example, two or more methods may be mixed to determine the in-plane distortion of the substrate 104. For instance, Fourier series analysis may be combined with finite difference analysis to determine the in-plane distortion of the substrate 104

In step 240, a process tool or overlay tool is adjusted based on the in-plane distortions found in step 220. In one embodiment, upon acquiring the in-plane distortions of the substrate in the chucked state, the controller 112 (or another controller) may use this information to diagnose one or more problems or errors with a process tool 113 located upstream from the substrate geometry tool 102. For example, such processing problems may include, but are not limited to, non-uniformities in film deposition, out-of-spec thermal processes and the like. In one embodiment, the controller 112 may feedback information to a process tool 113 so as to adjust or correct the process tool 113 such that process steps are brought back within tolerance levels.

In another embodiment, upon acquiring the in-plane distortions of the substrate in the chucked state, the controller 112 (or another controller) may use this information to feedforward information to a downstream metrology tool 118. For example, the in-plane distortion information (along with other wafer shape information) may be used in a feed-forward control scheme in an overlay advanced process control (APC) loop. The use of wafer shape analysis to predict errors in overlay is described generally in U.S. Patent Publication No. 2015/0120216 to Vukkadala et al., filed on Sep. 19, 2014, which is incorporated herein by reference in the entirety.

Figure 3:
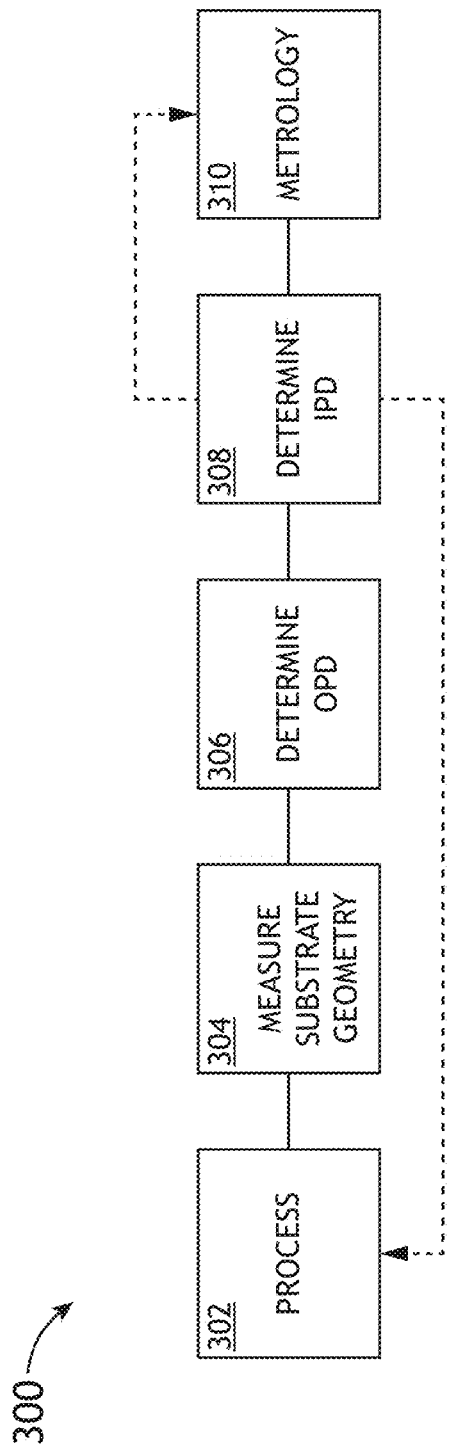
FIG. 3 is a flow diagram illustrating information feedback and feedforward based on acquired in-plane distortion results, in accordance with one embodiment of the present disclosure.

FIG. 3 illustrates a flow diagram 300 depicting information feedforward/feedback, in accordance with one embodiment of the present disclosure. In one embodiment, in step 302, one or more fabrication processes are carried out on a substrate. For example, one or more process tools (e.g., see process tool 113 in FIG. 1A) may carry out one or more fabrication processes on the substrate. In one embodiment, in step 304, following one or more processes 302, the geometry of the substrate is measured. For example, as shown in FIG. 1A, the substrate geometry may be measured with substrate geometry measurement tool 102. Then, in step 306, the out-of-plane distortions (OPD) of the substrate in an unchucked state are determined. In step, 308, based on the out-of-plane distortion, the in-plane distortion (IPD) of the substrate in a chucked state is determined. In one embodiment, based on the in-plane distortion acquired in step 308, feedforward information may be transmitted forward to one or more downstream metrology applications (e.g., overlay metrology tool). In another embodiment, based on the in-plane distortion acquired in step 308, feedback information may be transmitted to one or more upstream process tools (process 302) or one or more metrology tools (metrology 310).

While much of the present disclosure has focused on the analysis of effective surface film stress and/or in-plane distortions based on the 2-D plate model in a Cartesian coordinate system, it is noted that such an analysis may be extended generally to any coordinate system. For example, in vector notation Equation 7 above can be written as follows:

$$-\nabla^2 \begin{bmatrix} u_0 \\ v_0 \\ 0 \end{bmatrix} - \frac{(1+\upsilon)}{2} \nabla \times \nabla \times \begin{bmatrix} u_0 \\ v_0 \\ 0 \end{bmatrix} = \frac{h}{6} \nabla^2 (\nabla w_0) \qquad (8)$$

In one embodiment, equation (8) may be converted to cylindrical coordinates for the purposes of analyzing in-plane distortions in substrate 104. In cylindrical coordinate form, equation 8 is rewritten as follows:

$$-\nabla^2 \begin{bmatrix} u_r \\ v_\theta \\ 0 \end{bmatrix} - \frac{(1+\upsilon)}{2} \nabla \times \nabla \times \begin{bmatrix} u_r \\ v_\theta \\ 0 \end{bmatrix} = \frac{h}{6} \nabla^2 (\nabla w_z) \qquad (9)$$

Further, effective surface films stress of the substrate in an unchucked state and the subsequent in-plane distortions of the substrate in a chucked state may be determined using equation (9).

It is further noted that the analysis of the effective surface films stress of the substrate in an unchucked state and the subsequent in-plane distortions of the substrate in a chucked state may be carried out by variations of the 2-D plate model. For example, effective surface films stress of the substrate in an unchucked state and the subsequent in-plane distortions of the substrate in a chucked state may be carried out under an Euler-Lagrange framework. In this regard, the Euler-Lagrange approach solves the system through the minimization of energy utilizing the Euler-Lagrange equations of motion.

All of the methods described herein may include storing results of one or more steps of the method embodiments in a storage medium. The results may include any of the results described herein and may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc. Furthermore, the results may be stored "permanently," "semi-permanently," temporarily, or for some period of time. For example, the storage medium may be random access memory (RAM), and the results may not necessarily persist indefinitely in the storage medium.

Those having skill in the art will recognize that the state of the art has progressed to the point where there is little distinction left between hardware and software implementations of aspects of systems; the use of hardware or software is generally (but not always, in that in certain contexts the choice between hardware and software can become significant) a design choice representing cost vs. efficiency tradeoffs. Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations will typically employ optically-oriented hardware, software, and or firmware.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

What is claimed:

1. A system for determining in-plane distortions of a substrate comprising:
 a substrate geometry measurement tool configured to measure out-of-plane distortions of the substrate in an unchucked state; and
 a controller communicatively coupled to the measurement tool, the controller including one or more processors configured to execute a set of program instructions, the program instructions configured to cause the one or more processors to:
  receive one or more measurement results indicative of out-of-plane distortions of the substrate in the unchucked state from the measurement tool;
  determine an effective surface film stress of the substrate in the unchucked state based on the measured out-of-plane distortions of the substrate in the unchucked state with a two-dimensional plate model;
  determine in-plane distortions of the substrate in a chucked state based on the effective surface film stress of the substrate in the unchucked state with the two-dimensional plate model; and
  provide the at least one of the measured out-of-plane distortions or the determined in-plane distortions to at least one of a process tool or a metrology tool to adjust the at least one of the process tool or the metrology tool based on the at least one of the measured out-of-plane distortions or the determined in-plane distortions.

2. The system of claim 1, wherein the substrate geometry measurement tool comprises:
 a dual Fizeau interferometer.

3. The system of claim 1, wherein the determining an effective film stress of the substrate in the unchucked state based on the measured out-of-plane distortions of the substrate in the unchucked state with a two-dimensional plate model comprises:
 applying a fitting function to the measured out-of-plane distortions; and
 determining the effective film stress of the substrate in the unchucked state based on the fitted function with the two-dimensional plate model.

4. The system of claim 3, wherein the fitting function comprises:
 a Zernike polynomial.

5. The system of claim 1, wherein the determining an effective film stress of the substrate in the unchucked state based on the measured out-of-plane distortions of the substrate in the unchucked state with a two-dimensional plate model comprises:
 applying a finite difference approximation to determine the effective film stress of the substrate in the unchucked state with the two-dimensional plate model.

6. The system of claim 1, wherein the determining an effective film stress of the substrate in the unchucked state based on the measured out-of-plane distortions of the substrate in the unchucked state with a two-dimensional plate model comprises:
 applying a finite element approximation to determine the effective film stress of the substrate in the unchucked state with the two-dimensional plate model.

7. The system of claim 1, wherein the determining an effective film stress of the substrate in the unchucked state based on the measured out-of-plane distortions of the substrate in the unchucked state with a two-dimensional plate model comprises:
 applying a finite volume approximation to determine the effective film stress of the substrate in the unchucked state with the two-dimensional plate model.

8. The system of claim 1, wherein the determining in-plane distortions of the substrate in a chucked state based on the effective film stress of the substrate in the unchucked state with the two-dimensional plate model comprises:
 applying a finite difference approximation to determine the in-plane distortions of the substrate in a chucked state based on the effective film stress of the substrate in the unchucked state with the two-dimensional plate model.

9. The system of claim 1, wherein the determining in-plane distortions of the substrate in a chucked state based on the effective film stress of the substrate in the unchucked state with the two-dimensional plate model comprises:
applying a finite element approximation to determine the in-plane distortions of the substrate in a chucked state based on the effective film stress of the substrate in the unchucked state with the two-dimensional plate model.

10. The system of claim 1, wherein the determining in-plane distortions of the substrate in a chucked state based on the effective film stress of the substrate in the unchucked state with the two-dimensional plate model comprises:
applying a finite volume approximation to determine the in-plane distortions of the substrate in a chucked state based on the effective film stress of the substrate in the unchucked state with the two-dimensional plate model.

11. The system of claim 1, wherein the determining in-plane distortions of the substrate in a chucked state based on the effective film stress of the substrate in the unchucked state with the two-dimensional plate model comprises:
applying a method of moments approximation to determine the in-plane distortions of the substrate in a chucked state based on the effective film stress of the substrate in the unchucked state with the two-dimensional plate model.

12. The system of claim 1, wherein the metrology tool comprises:
an overlay metrology tool.

13. The system of claim 1, wherein the substrate comprises:
a semiconductor wafer.

14. A system for determining in-plane distortions of a substrate comprising:
a substrate geometry measurement tool configured to measure out-of-plane distortions of the substrate in an unchucked state; and
a controller communicatively coupled to the measurement tool, the controller including one or more processors configured to execute a set of program instructions, the program instructions configured to cause the one or more processors to:
receive one or more measurement results indicative of out-of-plane distortions of the substrate in the unchucked state from the measurement tool;
apply a two-dimensional plate model to determine in-plane distortions of the substrate in a chucked state based on the out-of-plane distortions of the substrate in the unchucked state; and
provide the at least one of the measured out-of-plane distortions or the determined in-plane distortions to at least one of a process tool or an overlay tool to adjust the at least one of the process tool or the overlay tool based on the at least one of the measured out-of-plane distortions or the determined in-plane distortions.

15. A system for determining in-plane distortions of a substrate comprising:
a substrate geometry measurement tool configured to measure out-of-plane distortions of the substrate in an unchucked state; and
a controller communicatively coupled to the measurement tool, the controller including one or more processors configured to execute a set of program instructions, the program instructions configured to cause the one or more processors to:
receive one or more measurement results indicative of out-of-plane distortions of the substrate in the unchucked state from the measurement tool;
apply an Euler-Lagrange plate model to determine in-plane distortions of the substrate in a chucked state based on the out-of-plane distortions of the substrate in the unchucked state; and
provide the at least one of the measured out-of-plane distortions or the determined in-plane distortions to at least one of a process tool or an overlay tool to adjust the at least one of the process tool or the overlay tool based on the at least one of the measured out-of-plane distortions or the determined in-plane distortions.

16. A method for determining in-plane distortions of a substrate comprising:
measuring one or more out-of-plane distortions of the substrate in an unchucked state;
determining, with a two-dimensional plate model, an effective film stress of a film on the substrate in the unchucked state based on the measured out-of-plane distortions of the substrate in the unchucked state;
determining, with the two-dimensional plate model, in-plane distortions of the substrate in a chucked state based on the effective film stress of the film on the substrate in the unchucked state; and
providing the at least one of the measured out-of-plane distortions or the determined in-plane distortions to at least one of a process tool or an overlay tool to adjust the at least one of the process tool or the overlay tool based on the at least one of the measured out-of-plane distortions or the determined in-plane distortions.

17. The method of claim 16, wherein the determining, with a two-dimensional plate model, an effective film stress of the substrate in the unchucked state based on the measured out-of-plane distortions of the substrate in the unchucked state comprises:
applying a fitting function to determine the effective film stress of the substrate in the unchucked state; and
determining the effective film stress of the substrate in the unchucked state based on the fitted function with the two-dimensional plate model.

18. The method of claim 16, wherein the determining, with a two-dimensional plate model, an effective film stress of the substrate in the unchucked state based on the measured out-of-plane distortions of the substrate in the unchucked state comprises:
applying a finite difference approximation to determine the effective film stress of the substrate in the unchucked state.

19. The method of claim 16, wherein the determining, with a two-dimensional plate model, an effective film stress of the substrate in the unchucked state based on the measured out-of-plane distortions of the substrate in the unchucked state comprises:
applying a finite element approximation to determine the effective film stress of the substrate in the unchucked state with the two-dimensional plate model.

20. The method of claim 16, wherein the determining, with a two-dimensional plate model, an effective film stress of the substrate in the unchucked state based on the measured out-of-plane distortions of the substrate in the unchucked state comprises:

applying a finite volume approximation to determine the effective film stress of the substrate in the unchucked state with the two-dimensional plate model.

21. The method of claim 16, wherein the determining, with the two-dimensional plate model, in-plane distortions of the substrate in a chucked state based on the effective film stress of the substrate in the unchucked state comprises:

applying a finite difference approximation to determine the in-plane distortions of the substrate in a chucked state based on the effective film stress of the substrate in the unchucked state with the two-dimensional plate model.

22. The method of claim 16, wherein the determining, with the two-dimensional plate model, in-plane distortions of the substrate in a chucked state based on the effective film stress of the substrate in the unchucked state comprises:

applying a finite element approximation to determine the in-plane distortions of the substrate in a chucked state based on the effective film stress of the substrate in the unchucked state with the two-dimensional plate model.

23. The method of claim 16, wherein the determining, with the two-dimensional plate model, in-plane distortions of the substrate in a chucked state based on the effective film stress of the substrate in the unchucked state comprises:

applying a finite volume approximation to determine the in-plane distortions of the substrate in a chucked state based on the effective film stress of the substrate in the unchucked state with the two-dimensional plate model.

24. The method of claim 16, wherein the determining, with the two-dimensional plate model, in-plane distortions of the substrate in a chucked state based on the effective film stress of the substrate in the unchucked state comprises:

applying a method of moments approximation to determine the in-plane distortions of the substrate in a chucked state based on the effective film stress of the substrate in the unchucked state with the two-dimensional plate model.

* * * * *